US005613094A

United States Patent [19]
Khan et al.

[11] Patent Number: 5,613,094
[45] Date of Patent: Mar. 18, 1997

[54] METHOD AND APPARATUS FOR ENABLING AN ASSEMBLY OF NON-STANDARD MEMORY COMPONENTS TO EMULATE A STANDARD MEMORY MODULE

[75] Inventors: Feroze R. Khan, Milpitas; Pranatharthi S. Haran, Fremont; Cong V. Trinh, San Jose; Mukesh Patel, Pleasanton, all of Calif.

[73] Assignee: Smart Modular Technologies, Fremont, Calif.

[21] Appl. No.: 325,651

[22] Filed: Oct. 17, 1994

[51] Int. Cl.$^6$ .................................................. G06F 12/06
[52] U.S. Cl. .......................... 395/500; 395/405; 395/507; 365/193; 365/230.03
[58] Field of Search .................................. 395/500, 164, 395/165, 166, 325, 401, 402, 403, 405, 438; 365/193, 222, 230.03, 233, 236

[56] References Cited

U.S. PATENT DOCUMENTS

| | | | |
|---|---|---|---|
| 5,253,357 | 10/1993 | Allen et al. | 395/442 |
| 5,265,053 | 11/1993 | Naradone et al. | 365/193 |
| 5,343,438 | 8/1994 | Choi et al. | 365/233 |
| 5,345,574 | 9/1994 | Sakurada et al. | 395/442 |
| 5,349,566 | 9/1994 | Merritt et al. | 365/233.5 |
| 5,371,866 | 12/1994 | Cady | 365/193 |
| 5,452,257 | 9/1995 | Han | 365/230.03 |

*Primary Examiner*—Kevin J. Teska
*Assistant Examiner*—Tan Q. Nguyen
*Attorney, Agent, or Firm*—Claude A. S. Hamrick; Emil C. Chang

[57] ABSTRACT

A memory module using non-standard configuration memory devices while allowing access by computer systems is disclosed. In one example, according to the JEDEC standard 2M×36 configuration, the memory module is comprised of two banks of 1M deep memory blocks. For this JEDEC standard configuration, the computer system will provide four Row Address Strobe (RAS) signals, four Column Address Strobe (CAS) signals, a Write Enable signal, and ten address signals, A0–A9. The RAS and CAS signals allow memory blocks of the memory banks to be accessed. However, with only ten address signals, only 1M deep memory devices having 1M deep memory locations can be addressed. In order to use 2M deep memory devices having 2M deep memory locations, an eleventh address signal (A10) is needed. A logic circuit is thus provided to derive an additional address signal and to provide the needed refresh cycle for the second 1M memory locations of the 2M deep memory devices.

38 Claims, 5 Drawing Sheets

METHOD AND APPARATUS FOR ENABLING AN ASSEMBLY OF NON-STANDARD MEMORY COMPONENTS TO EMULATE A STANDARD MEMORY MODULE

BACKGROUND OF THE INVENTION

1. Field of the Invention

The present invention relates to the field of computer memory hardware. More particularly, the present invention relates to an improved memory circuit board apparatus designed to perform with computer systems notwithstanding the lack of an industry standard memory devices organization and providing for the use of certain types of memory devices having non-standard depths.

2. Brief Description of the Prior Art

A computer system typically requires a certain minimum amount of memory in order to operate at an acceptable level of processing speed. If more memory is added to the computer system, there will be a higher level of computational speed.

One type of memory module is the Single In Line Memory Module ("SIMM") wherein a number of memory devices (chips) are mounted on a small circuit board having an edge connector with a number of pins. These memory devices can be either dynamic random access memory devices ("DRAM") or static random access memory devices ("SRAM"). The number of addressable locations within the memory device is referred to as the depth of the device. Size or depth of memory devices is typically referred to in units of "K" and "M", with 1K being 1024 units and 1M being 1024K units.

SIMMs can be readily plugged into or removed from a system board designed to accept such SIMMs. The SIMMs receive all necessary power, ground, and logic signals from the system board.

In order to provide compatibility between computer system and memory modules from the various manufacturers, the JEDEC council of the Electronic Industries Association provides a number of industry standards. By designing and producing system boards and memory modules according to these standards, compatibility between the different system boards and memory modules is ensured. More specifically, JEDEC Standard No. 21-C covers memory modules and cards, including the 72-pin DRAM Module Family. Under this standard, the following memory configurations for 72-pin DRAM memory modules are specified:

TABLE 1

| Configuration | Depth of Memory Device | Banks |
| --- | --- | --- |
| 256K × 36 | 256K | 1 |
| 512K × 36 | 256K | 2 |
| 1M × 36 | 1M | 1 |
| 2M × 36 | 1M | 2 |
| 4M × 36 | 4M | 1 |
| 8M × 36 | 4M | 2 |

Note that the depths of the memory devices in Table 1 are 256K, 1M, or 4M. Since this standard supports either one or two banks of memory, certain new memory DRAMs with single Row Address Strobe ("/RAS") control signals cannot be used in the above configurations. For example, DRAMs such as the 512K×8 DRAM with single RAS control signal, the 2M×8 DRAM with single RAS control signal, and the 8M×8 DRAM with single RAS control signal are available (or will soon be available) but cannot be used in the above JEDEC specified configurations. However, they can be used in the following configurations:

TABLE 2

| Configuration | Depth of Memory Device | Banks |
| --- | --- | --- |
| 512K × 32/36 | 512K | 1 |
| 2M × 32/36 | 2M | 1 |
| 8M × 32/36 | 8M | 1 |

Note that the depth of the memory devices in Table 2 includes 512K, 2M, and 8M. However, the above memory module configurations are not compatible with computer systems conforming to JEDEC standards because these configurations are not provided under the JEDEC standard.

More specifically, because computer systems conforming to the JEDEC standard do not accommodate 512K, 2M, or 8M memory devices on memory modules, they do not provide the needed address signals for these configurations. For example, under the JEDEC standard, a 2M×36 configuration has to use two banks of 1M deep memory devices (see Table 1), rather than one bank of 2M deep memory devices (see Table 2). A memory module using one bank of 2M deep memory devices will not function properly because the computer system only provides ten address signals to address 1M deep memory devices rather than the needed eleven address signals to address 2M deep memory devices. Specifically, the address signals A9 for the 512K deep DRAM, A10 for the 2M deep DRAM, and A11 for the 8M deep DRAMs are not provided. Thus, these memory devices cannot be used unless some specific logic is provided.

As the supply and demand of memory devices fluctuate and the memory devices of Table 2 become widely available and provide better price/density ratio, there is a strong incentive to use these non-standard configurations and memory devices. For example, 1M×4 DRAMs are becoming less available while 2M×8 DRAMs are becoming more readily available and their prices are dropping.

In addition to the cost consideration, using the nonstandard memory devices also reduces power consumption. By using only 1 bank of memory devices instead of two banks of memory devices as required under the JEDEC standard, less power is needed. Also, capacitive loading is drastically reduced, due to the use of fewer devices, thus providing better capability to increase the number of SIMMs installable in the computer system.

There are several problems presented in using memory devices not provided for under the JEDEC standard. Before discussing these problem, memory module configuration according to the JEDEC standard is explained in detail.

Referring now to FIG. 1 of the drawing, an electrical schematic depiction of a two bank, two megabit ("Mb") deep×36 memory module configuration according to the JEDEC standard specification is illustrated. This memory module is comprised of a circuit board, as suggested by the dashed lines 9, adapted to carry two banks 10 and 12 of memory blocks, and includes means for conducting a set of input signals 30–46, a set of output signals, and an output bus 47. Each bank in this configuration includes four 1Mb ×9 memory blocks 14, 16, 18, and 20 in bank 10, and memory blocks 22, 24, 26, and 28 in bank 12. Each 1 Mb×9 memory block can be comprised of two 1 Mb×4 memory devices plus a 1 Mb×1 memory device, nine 1 Mb×1 memory devices, or other combinations of memory devices. Each memory device is a single IC chip contained within a

3 standard device package. Under the JEDEC standard for 72 pin SIMMs, only 1M deep memory devices can be used instead of 2M deep memory devices.

There are a number of input signals to be applied to each of the memory devices. These signals include four Column Address Strobe ("CAS") signals, "/CAS0" input at 36, "/CAS1" input at 34, "/CAS2" input at 32, and "/CAS3" input at 30, four Row Address Strobe ("RAS") signals, "/RAS0" input at 38, "/RAS1" input at 40, "/RAS2" input at 42, and "/RAS3" input at 44, a Write Enable ("/WE") signal input at 45, and ten address signals (A0–A9) input at 46. There are also power input signals, ground signals, and an Output Enable ("/OE") signal which in the interest of simplicity are not shown. The /OE signal is typically grounded in this configuration.

Note that the /RAS, /CAS, /OE, and /WE signals are active low signals, meaning "ON" or active when there is a low voltage level on the line and "OFF" when there is a high voltage level on the line. Active low signals such as the CAS signals are commonly expressed as "/CAS", or with a horizontal bar over it. Further note that it is understood that the various signals are propagated on the circuit board to various components or pins via electrical traces or lines.

The CAS and RAS signals in conjunction allow addressing of each of the memory blocks. By activating the corresponding RAS and CAS signals each memory block can be individually selected. Once the memory block is selected, the specific location within the memory block is accessed via the address signals, A0–A9. With these ten address signals, 1M deep memory locations can be accessed. Depending on a high or low /WE signal, a read or write operation can be made to the addressed memory location.

In a read operation, the corresponding data from the addressed location is sent out to the data bus 47. For example, memory block 20 or 28 sends out 9 bits of data via a sub-bus 48 to the data bus 47; and memory block 18 or 26 sends out 9 bits of data via another sub-bus 50 to the data bus 47. Memory block 16 or 24 and memory block 14 or 22 send out another 18 bits of data via sub-buses 52 and 54 for a total of 36 bits to the data bus 47.

Note that there are 9 bits of data obtained from each memory block in this illustration. The 9 bits of data is typically 8 bits of information data and 1 parity bit for error checking. With a set of four blocks of memory devices, there are a total of thirty-six bits. While under the JEDEC standard 36 bits of data are specified, in other configurations where there are no parity bits, each memory block outputs 8 bits of data for a total of thirty-two bits of data. In this case, a data bus width of thirty-two bits is sufficient. The present invention will work with both cases.

In order to use one bank of 2M deep memory devices, instead of two banks of 1M deep memory devices, there are several problems that need to be resolved. First of all, because the computer system recognizes the memory module as a two bank, 1M deep memory device module instead of a one bank, 2M deep memory device module, it will provide the same set of signals as illustrated in FIG. 1. However, with ten address signals, only 1M depth can be addressed. The second 1M depth cannot be accessed without additional circuit logic to provide an additional address signal. Furthermore, with only four memory blocks in an one bank system, instead of eight memory blocks in the two bank system, only two RAS signals are needed rather than the four RAS signals provided by the computer system. Additional logic is also needed to translate the four RAS signals into two RAS signals for the memory blocks.

4

SUMMARY OF THE INVENTION

An object of the present invention is to provide a memory module apparatus using memory devices not provided for under industry standards that can accept signals from a computer system and translate these signals such that the memory modules can be properly read, written, and refreshed.

A further object of the present invention is to provide a method for allowing memory modules previously requiring two banks of memory devices to use only one bank of memory devices, thereby reducing power consumption and capacitive loading.

Another object of the present invention is to provide a method and apparatus utilizing higher depth memory devices which are decreasing in price.

The present invention can be implemented in a variety of non-standard memory configurations. For discussion and illustration purposes, the implementation of a 2M×32/36, one bank non-standard 72 pin memory module of Table 2 supra is discussed. According to the JEDEC standard 2M×36 configuration, the memory module is comprised of two banks of 1M deep memory blocks. For this JEDEC standard configuration, the computer system will provide four RAS signals, four Column Address Strobe signals, a Write Enable signal, and ten address signals, A0–A9. The RAS and CAS signals allow memory blocks of the memory banks to be accessed. However, with only ten address signals, only 1M deep memory locations can be addressed. In order to address 2M deep memory devices, an eleventh address signal (A10) is needed. The present invention uses additional logic to derive an eleventh address signal from the RAS signals. In addition, during refresh cycles, the computer system will only provide signals to refresh 1M of the memory locations; but for the logic of the preferred embodiment, the second 1M of memory locations would not be refreshed and the data would be lost. The present invention thus provides the needed logic so that the full 2M memory locations will be refreshed. In effect, the preferred embodiment of the present invention emulates a two bank, 1M depth per bank memory module system with a one bank, 2M deep memory module system.

The present invention thus allows memory modules with non-standard memory configurations to be properly addressed and accessed by a computer system. The present invention can provide for SIPs and other types of memory circuit boards as well.

These and other objects and advantages of the present invention will no doubt become apparent to those skilled in the art after having read the following detailed description of the preferred embodiment which is illustrated in the several figures of the drawing.

IN THE DRAWING

DETAILED DESCRIPTION OF THE PREFERRED EMBODIMENT

Figure 2:
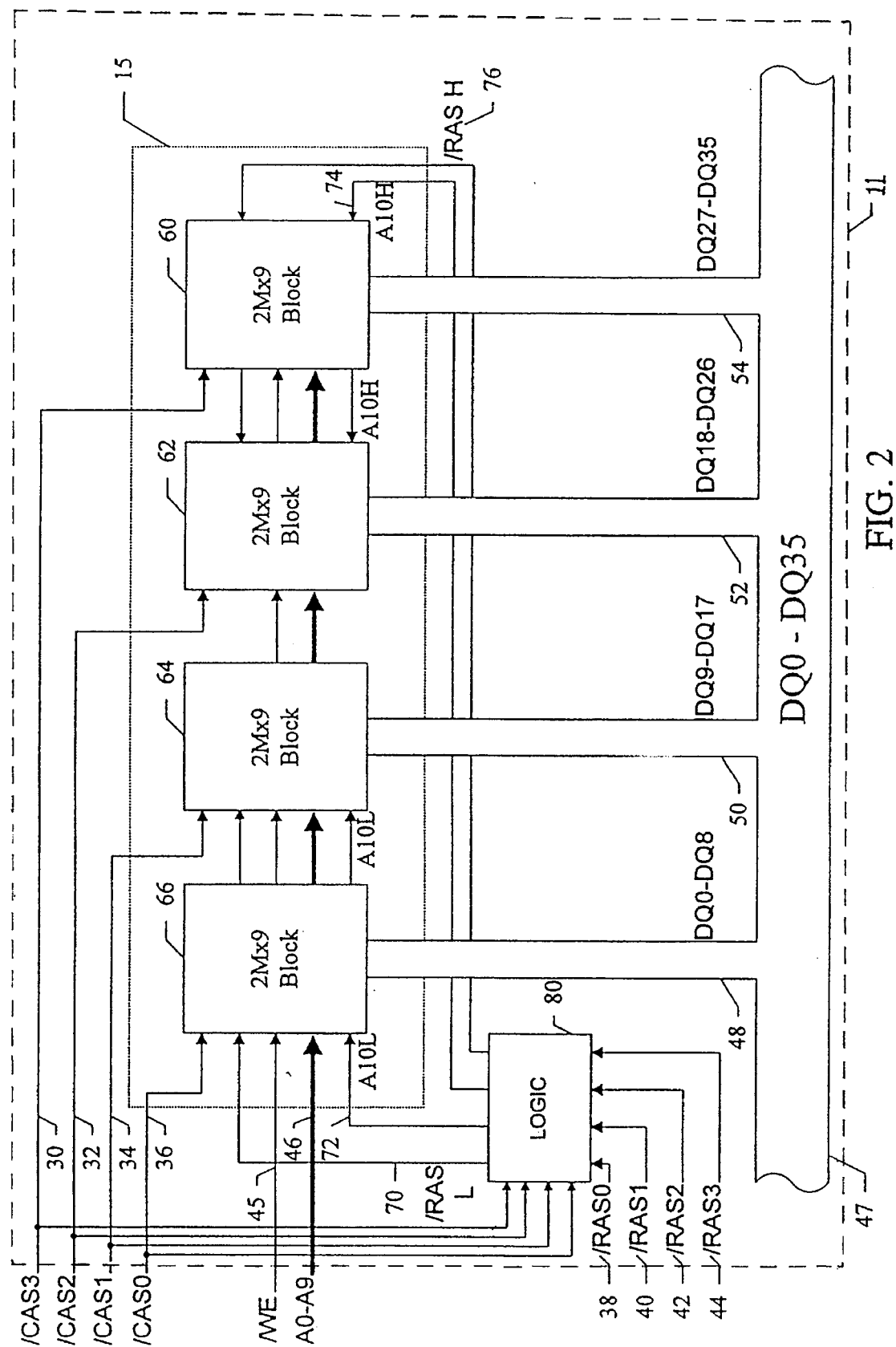
FIG. 2 is a block diagram illustrating a 2M×36 memory module using 2M deep memory devices in accordance with the present invention.

Referring to FIG. 2, an electrical schematic depiction of a memory module containing an embodiment of the present invention is illustrated. In this embodiment, there is but one bank 15 of memory blocks, and each memory block, 60 62 64 66, is 2M deep instead of 1M deep.

Figure 1:
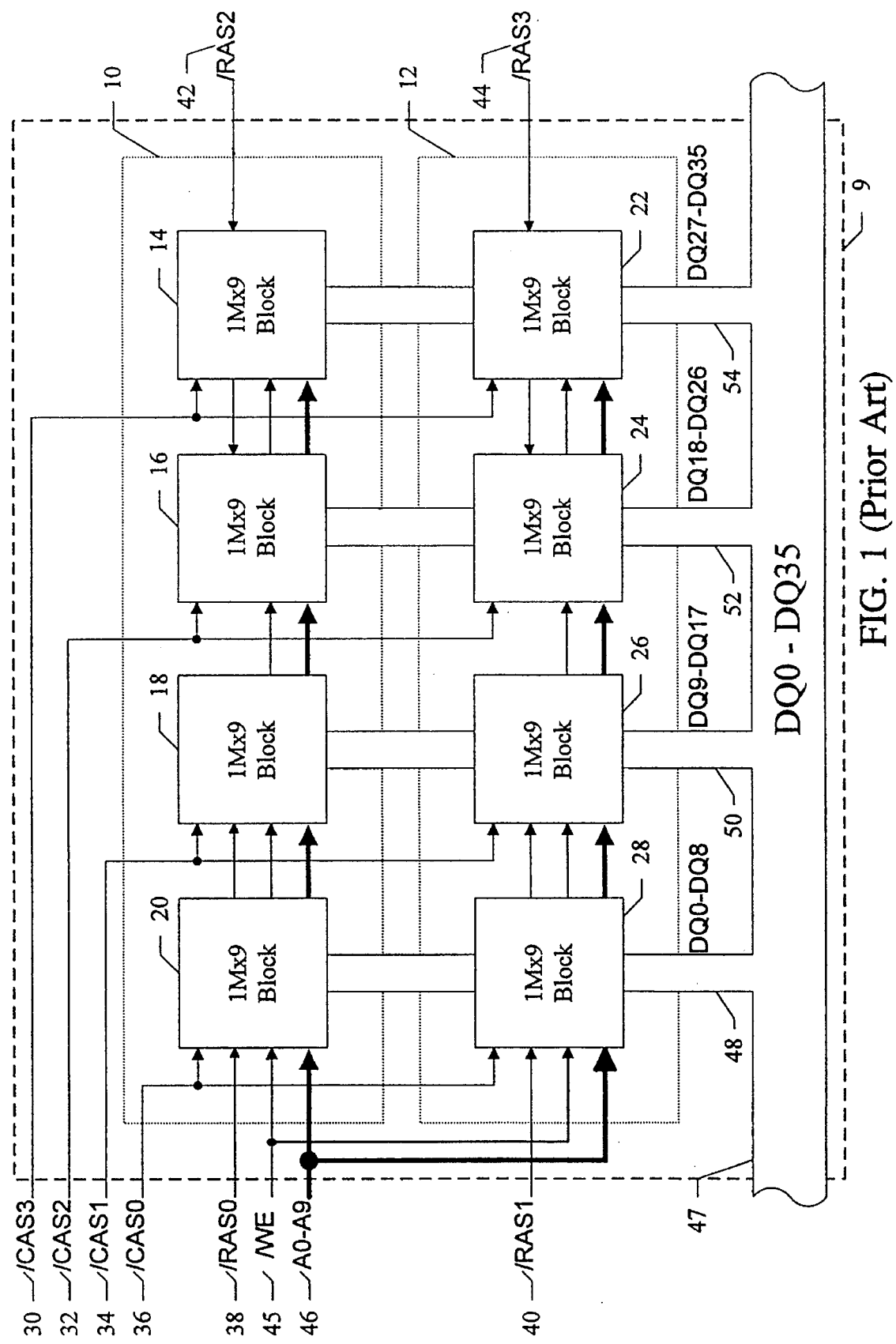
FIG. 1 is a block diagram illustrating a JEDEC standard 2M×36 memory module using 1M deep DRAMs.

The set of input signals to the memory module is the same set of input signals as in FIG. 1. As illustrated, the RAS signals are routed to a logic block 80 which is also resident on the module circuit board 11. In addition to going to the respective memory blocks, the CAS signals are routed to logic block 80 as well. In response, the logic block outputs a /RAS L (lower bank) signal 70 to memory blocks 64 and 66, a /RAS H (higher bank) signal 76 to memory blocks 60 and 62, a first address signal, A10L (lower bank) 72, to memory blocks 64 and 66, and a second address signal, A10H (higher bank) 74, to memory blocks 60 and 62. Each CAS signal addresses one memory block instead of two. The /WE signal and address signals A0 to A9 go to each memory block as before.

When properly addressed, the respective memory blocks transfer data to and from the data bus 47 via sub-buses 48, 50, 52, 54, in the same manner as described above.

Figure 3:
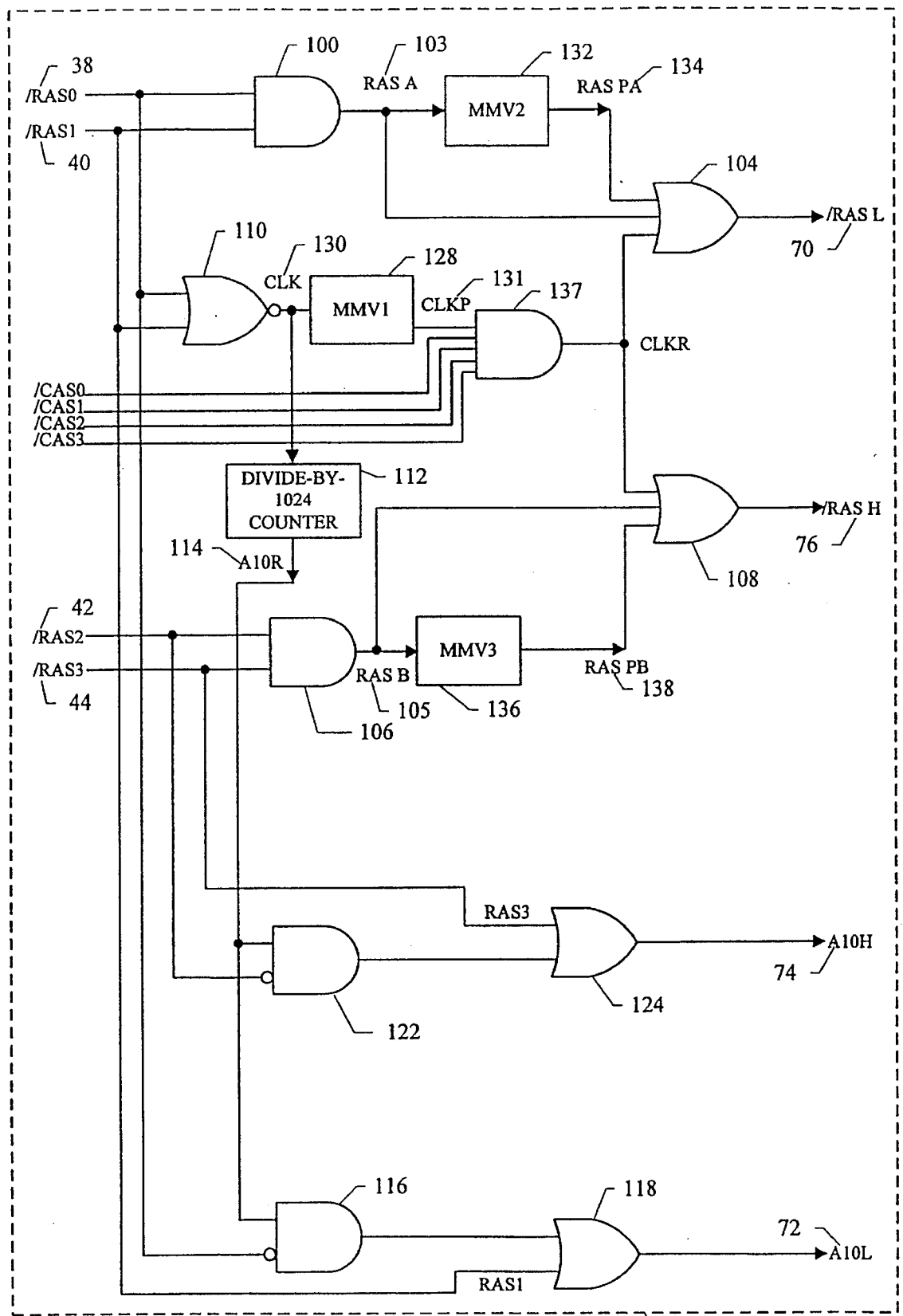
FIG. 3 is an electrical schematic diagram showing the principal components of the logic block illustrated in FIG. 2.

Referring to FIG. 3, an embodiment of a logic circuit 80 in accordance with the present invention is illustrated. Note that /RAS0 and /RAS1 can be considered as one set of signals and /RAS2 and /RAS3 can be considered as a second set of signals. These two sets of signals perform the same functions except to different memory blocks. Unless specifically provided, it shall be understood that the two sets of signals are processed using the same logical reasoning.

Generating Correct RAS Signals

In a one bank memory module system, only two RAS signals are necessary to access the four memory blocks. With four RAS signals provided by the computer system, these signals have to be logically sorted and processed into two RAS signals. When /RAS0 or /RAS1 is active, the corresponding output /RAS L should be active to access memory blocks 64 and 66. When /RAS2 or /RAS3 is active, the corresponding output /RAS H should be active to access memory blocks 60 and 62. The following truth tables illustrate the logic to generate /RAS L for memory blocks 64 and 66, and /RAS H for memory blocks 60 and 62:

| Condi- | Truth Table 3a AND Gate 1 | | | Truth Table 3b AND Gate 2 | | |
|---|---|---|---|---|---|---|
| | Inputs | | Output | Inputs | | Output |
| tion | /RAS0 | /RAS1 | /RAS L | /RAS2 | /RAS3 | /RAS H |
| 1 | L | L | L | L | L | L |
| 2 | L | H | L | L | H | L |
| 3 | H | L | L | H | L | L |
| 4 | H | H | H | H | H | H |

L: Low, H: High

Condition 1, where both /RAS0 and /RAS1 go low, indicates that this is a refresh cycle where the memory devices are to be refreshed. The /RAS L signal consequently should be low. Refresh methods are further explained in the next section.

Condition 2, where /RAS0 is low and /RAS1 is high, indicates that this is a read or write cycle to the lower memory locations of the memory blocks (the first 1M memory locations), and /RAS L correspondingly needs to be active (or low).

Condition 3, where /RAS0 is high and /RAS1 is low, indicates that this is a read or write cycle to the higher memory locations of the memory blocks (the second 1M memory locations), and /RAS L again needs to be active (or low).

In condition 4, both /RAS0 and /RAS1 are high. This is typically the condition where the memory devices are setting up for the next cycle or are in standby (inactive) condition, and /RAS L is set to high as well to setup or to standby the memory devices.

The logic of table 3a is implemented by an AND gate 100 which produces a RAS A signal 103 that passes through an OR gate 104 to produce the /RAS L signal that is passed to the memory devices.

Similarly, the logic of table 3b is implemented in the same manner for signals /RAS2 and /RAS3 using an AND gate 106 to produce a RAS B signal to pass to an OR gate 108 to produce the /RAS H signal.

Refresh Cycles

DRAM memory devices must be periodically refreshed in order to maintain the stored information in the memory cells. Otherwise, the information will be lost. There are two common types of refresh methods, CAS-Before-RAS ("CBR") and RAS-Only Refresh. Computer systems can implement either one of the two refresh techniques because the DRAMs can recognize and support both methods.

Refresh Method—CBR

Figure 4A:
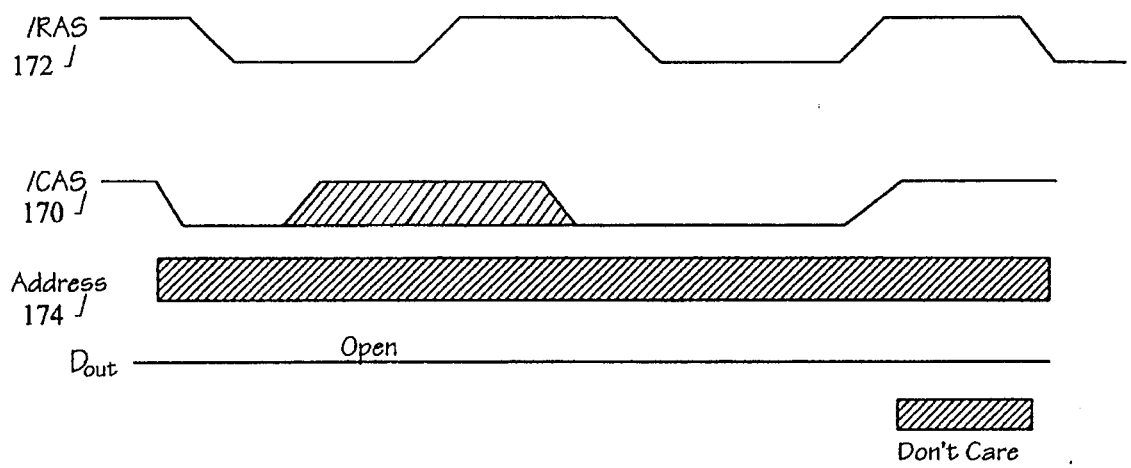
FIG. 4a is a timing diagram illustrating the states of RAS signal and CAS signal used to initiate a CAS-Before-RAS type refresh cycle.

FIG. 4a illustrates the signal patterns to initiate a CAS-Before-RAS refresh cycle. The /CAS signal 170 goes active first, and while /CAS is active the /RAS signal 172 goes active as well. The states of the address signals 174 do not matter because it is not used. Because the /CAS signal goes active before the /RAS signal, this refresh method is called CAS-Before-RAS or CBR.

To initiate a CBR refresh cycle, the computer system sends this particular pattern of /CAS and /RAS signals to the memory devices. The memory devices detect this pattern and internally generate the addresses for refreshing the entire array of memory cells and do not need any address information from the computer system. The present invention will have no problem passing the CBR refresh cycle signals to the memory devices to initiate CBR refresh.

During CBR refresh cycles, there could be a phase shift between /RAS0 and /RAS1 (or /RAS2 and /RAS3) which will unnecessarily trigger a part of the logic circuit of the present invention. An AND gate (FIG. 3, 137) has been placed in the circuit such that the $t_{RP}$ pulse from MMV1 is send to the memory devices only during RAS-Only refresh cycles when all the /CAS signals are high.

Refresh Method—RAS-Only Refresh

Figure 4B:
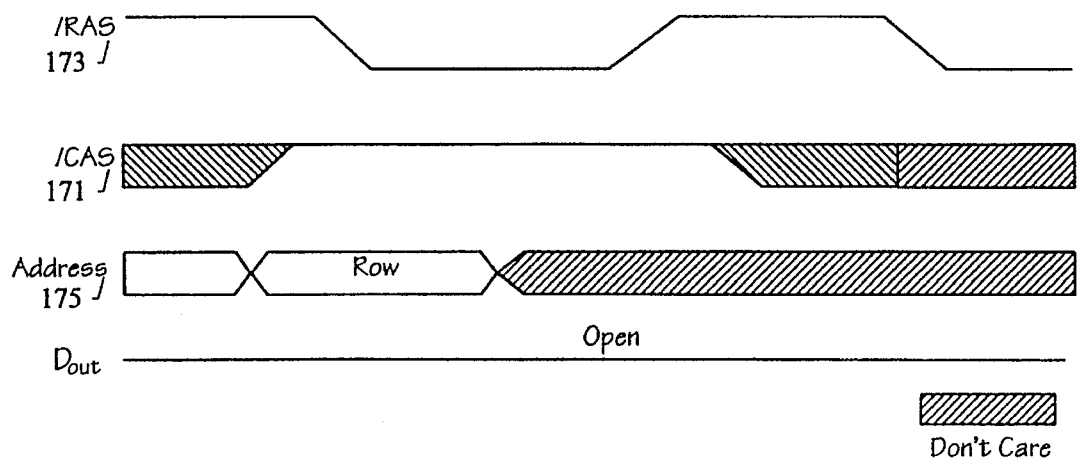
FIG. 4b is a timing diagram illustrating the states of RAS signal, CAS signal, and address signals used to initiate a RAS-Only type refresh cycle.

In a RAS-Only Refresh cycle the DPAMs need from the computer system both the correct pattern of RAS signals to indicate a refresh cycle and the proper address information. If the RAS signal is active with CAS signal being high, the DRAMs recognize this RAS-Only refresh cycle and therefore need addresses from the computer. Referring to FIG. 4b, the address signals 175 are first set up for a predetermined period of time, the /CAS signal 171 is held high, and the /RAS signal 173 goes active.

In this situation, the logic of the present invention must ensure that the correct address information is provided to the DRAMs. More specifically, the logic must generate the needed A10 address signal to refresh the entire 2M deep memory devices. Because the computer system only provides ten address signals A0–A9, only 1M depth of the memory devices can be addressed. Without an eleventh address signal, the second 1M depth of the memory devices will not be refreshed and will be lost.

Generating the Eleventh Address Line (A10)

In providing the eleventh address signal, A10, the logic will necessarily provide for normal read and write cycles and the refresh cycles. The following truth tables illustrate the conditions:

|  | Truth Table 4a | | | | Truth Table 4b | | | |
| --- | --- | --- | --- | --- | --- | --- | --- | --- |
|  | Inputs | | | Output | Inputs | | | Output |
| Cond. | /RAS0 | /RAS1 | A10R | A10L | /RAS2 | /RAS3 | A10R | A10H |
| 1 | L | L | L | L | L | L | L | L |
| 2 | L | L | H | H | L | L | H | H |
| 3 | L | H | X | H | L | H | X | H |
| 4 | H | L | X | L | H | L | X | L |
| 5 | H | H | X | H | H | H | X | H |

L: Low, H: High, X: Don't Care

In truth tables 4a and 4b, conditions 1 and 2 provide for the refresh cycles to the memory devices, and conditions 3 and 4 refer to read or write cycles to the memory devices. Condition 5 is typically a condition between cycles to allow the memory devices to setup for a new cycle or be in standby condition.

Conditions 1 and 2 indicate refresh cycles, and the output A10L (or A10H), which is the eleventh address signal, can be either high or low. In a RAS-Only-Refresh method, the computer system provides all the necessary address information to the memory module to refresh the memory devices. Again, because the computer system only provides ten address signals, an eleventh address signal is needed. The state of this address signal is generated by counting the number of refresh cycles. There are 1024 rows of memory cells addressed by the first ten address signals and another 1024 rows of memory cells are addressable with the generation of an eleventh address signal. Therefore, after every 1024 cycles, the eleventh address line needs to be toggled from high to low or from low to high. The logic 80 provides a counter to count the number of refresh cycles and to toggle a signal, A10R 114, every 1024 cycles. During RAS-Only refresh cycles, output signal A10L and A10H are set to follow the A10R signal.

Referring back to FIG. 3, address generation during the refresh cycles is implemented by a NOR gate 110 that outputs a CLK signal 130 that is high whenever /RAS0 and /RAS1 are low. The high signal advances a counter 112 by one count. When the counter reaches multiples of 1024 it toggles its output signal, A10R 114. Signal A10R is fed into an AND gate 116. The other input to this AND gate is an inverted /RAS0 signal. The output of the AND gate goes to an OR gate 118 which outputs the A10L signal 72.

In condition 3, /RAS0 is low and /RAS1 is high, the first 1M memory locations are being addressed and the corresponding A10L signal is high. In condition 4, /RAS0 is high and /RAS1 is low, the second 1M memory locations are being addressed and the corresponding A10L signal is low.

In condition 5, where /RAS0 and /RAS1 are both high, this condition typically occurs to setup a new cycle or to standby the memory devices and the A10L signal output is not significant. For sake of consistency, signal A10L is set to /RAS1.

In implementation of conditions 3, 4, and 5, an examination of truth table 4a shows that A10L follows /RAS1. Thus, /RAS1 is input to the OR gate 118 to output the A10L signal.

The combination of AND gate 116 and OR gate 118 allows the A10R signal 114 to pass through to the A10L signal when both /RAS0 and /RAS1 signals are low. When either RAS signal is high (generally it is not a refresh cycle) or when both RAS signals are high, A10R is not allowed to pass through to A10L or A10H, and A10L should follow /RAS1.

Truth table 4b shows the same logic using signals /RAS2, /RAS3 and A10R. The resulting output A10H 74 is produced in the same manner using the A10R signal 114, an AND gate 122, and an OR gate 124 to output A10H 74.

Out-Of-Phase RAS Signals For Refresh

One other problem the logic of the present invention must provide for is when /RAS0 and /RAS1 signals do not go low simultaneously in RAS-Only-refresh cycles. In this type of refresh cycle, both of the RAS signals, /RAS0 and /RAS1, typically go low simultaneously. However, in some computer systems, in order to reduce peak inrush current, one RAS signal is set to go low first and after 25–35 ns the other RAS signal goes low. In this situation where the RAS signals are out-of-phase, extra logic must be provided to recognize and properly respond to these out-of-phase signals. Otherwise, the out-of-phase signal would be misinterpreted as a read or write cycle instead of a refresh cycle. Furthermore, because the second RAS signal goes low, the address signal A10L and A10H might change value (because during this period A10R, whose condition is unknown, outputs to A10L and A10H). Changing the address during the address "hold time" of a cycle violates memory device timing requirements and the SIMM will malfunction.

To solve this out-of-phase signal problem, the present invention provides logic such that whenever out-of-phase signals are detected, a new refresh cycle will be initiated. In effect, the out of phase portion of the RAS signal is discarded and a new refresh cycle is initiated with the RAS signals in phase.

To initiate a new cycle, /RAS L and /RAS H need to be high for a time period of $t_{RP}$ (RAS Pre-Charge time). When the memory devices receive a $t_{RP}$ pulse, it sets up a new cycle.

To generate this pulse of time period $t_{RP}$, a monostable multivibrator ("MMV") circuit is used. The MMV circuit is commonly available and can be custom configured. In the preferred embodiment, the MMV circuit is setup to trigger by a rising edge where the input signal to the circuit is going from a low state to a high state. Once the MMV circuit is triggered, it maintains a high pulse for a time period of $t_{RP}$.

This MMV circuit, MMV1 128, is implemented after the NOR gate 110 and the output of the MMV1 circuit passes to an AND gate 137. The other inputs to the AND gate are CAS signals having states that are high during RAS-Only-refresh cycles. This AND gate serves to block the output of the MMV1 circuit during non-RAS-Only-refresh cycles. The output of the AND gate passes to the OR gate 104 to modify the /RAS L signal (or the OR gate 108 to modify the /RAS H signal).

Insufficient Time Between Cycles

Another problem the logic of the present invention must deal with is when the computer reads or writes to the two banks of memory devices of FIG. 1 too fast such that the time period, $t_d$, between the different cycles is too short for the memory devices of FIG. 2 to properly setup for the new cycle. In a two bank system where both banks can be accessed alternately, the computer system can quickly access one bank and then access the other bank without meeting the $t_{RP}$ requirement. In a one bank system, there must be sufficient time between the cycles for the one bank of memory devices to setup.

The time necessary for the memory devices to setup between cycles is again $t_{RP}$. So, when $t_d$ is smaller than $t_{RP}$, the memory devices may malfunction. The solution to this problem is to ensure that the setup time between cycles is sufficient.

MMV circuits again are used to implement the needed logic. Whenever /RAS0 and /RAS1 both go high to setup for a new cycle, AND gate 100 will produce a high signal, RAS A 103, which triggers a MMV circuit, MMV2 132. This MMV circuit in turn will produce a pulse width of time period $t_{RP}$ on the /RAS PA signal 134 which is passed to OR gate 104 to modify the /RAS L signal. In the same manner, when /RAS2 and /RAS3 go high to set up for a new cycle, the AND gate 106 produces a high signal, RAS B 105, that triggers a MMV3 circuit 136 that outputs the /RAS PB signal 138. This signal goes to the OR gate 108 to modify /RAS H.

Cycles

Figure 5:
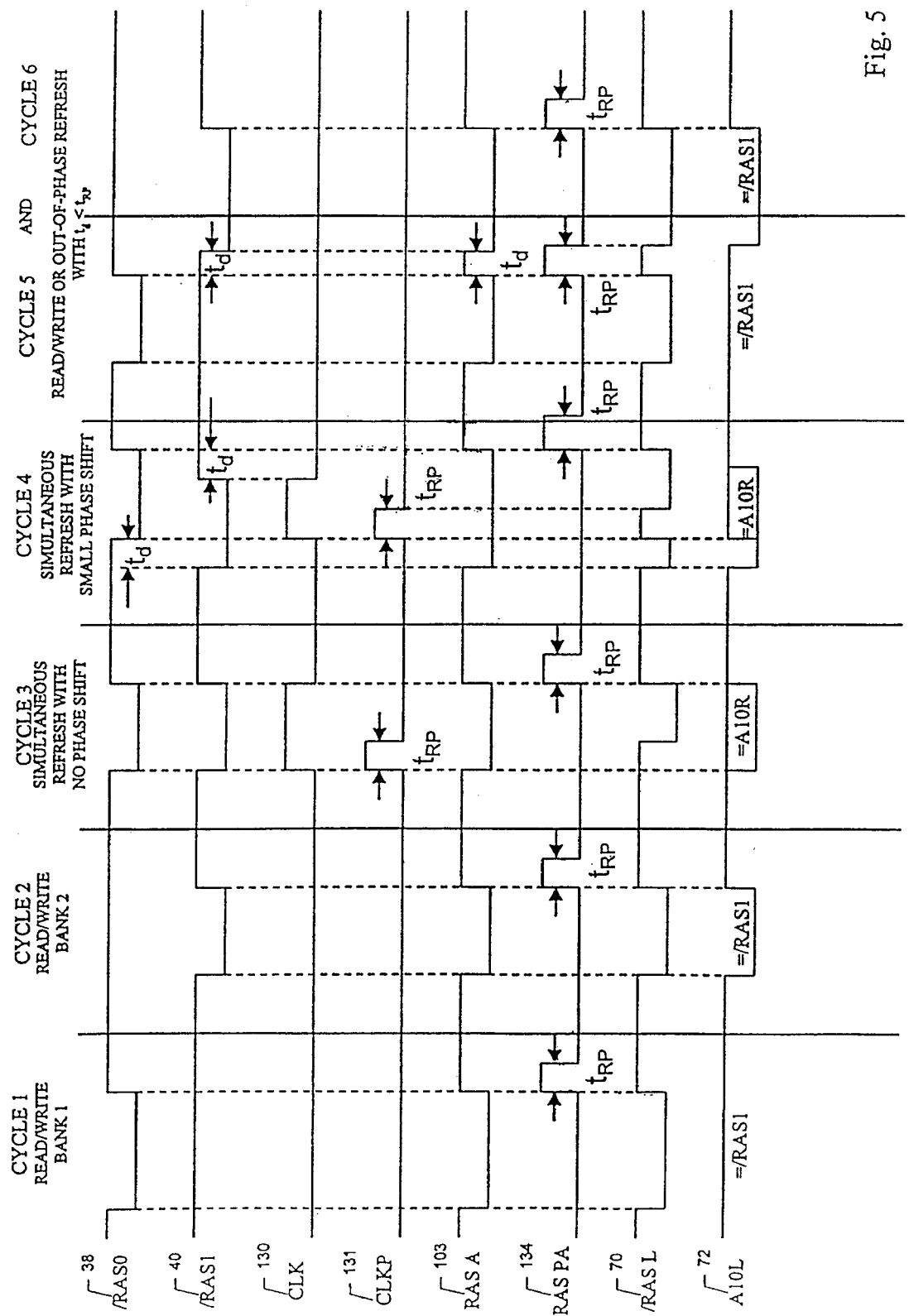
FIG. 5 is a signal state and timing diagram showing various signals appearing in the electrical schematic diagram of FIG. 3.

The timing and states of the signals at various locations of the circuit are illustrated in FIG. 5. There are eight signals depicted in this figure. There are two input signals, /RAS0 38 and /RAS1 40, two output signals, /RAS L 70 and A10L 72, two signals, CLK 130 and CLKP 131, to provide for the out-of-phase refresh signal situation and the clock signal for A10R signal (refresh address signal) generation, and two signals, RAS A 103 and RAS PA 134, to provide for the situation where there is insufficient time between accesses to the one bank of memory devices.

Cycle 1 is a read or write cycle of lower memory locations where /RAS0 is low and /RAS1 is high. In this cycle, signals CLK and CLKP are not triggered, and RAS A is low. When /RAS0 returns to high, the MMV circuit, MMV2 132, is triggered to produce a $t_{RP}$ pulse on the RAS PA signal. The output signal /RAS L follows the RAS A and the pulse on the RAS PA signal does not affect the /RAS L signal as the latter is already high. The output signal A10L equals to /RAS1 so it's high.

Cycle 2, similar to cycle 1, is a read or write cycle of the higher memory locations where /RAS0 is high and /RAS1 is low. The CLK and CLKP signals are not triggered, and RAS A is low. When /RAS1 goes high, a $t_{RP}$ pulse is produced on the RAS PA signal. The output signal /RAS L is low and is not affected by the $t_{RP}$ pulse from RAS PA as it is already high at that point in time. Signal A10L follows /RAS1 and is low.

Cycle 3 is a refresh cycle where /RAS0 and /RAS1 go low without significant phase shift. The CLK signal will be high and will trigger the CLKP signal to produce a $t_{RP}$ pulse. This $t_{RP}$ pulse does not serve a useful purpose in this cycle. RAS A is again low from the AND gate and when RAS A returns to high (when /RAS0 and /RAS1 become inactive), the RAS PA signal is triggered to produce a $t_{RP}$ pulse that has no effect on output signal /RAS L as it is already high at this point in time. The A10L signal could be either high or low depending on the A10R signal from the counter.

Cycle 4 illustrates a refresh cycle where /RAS0 and /RAS1 do not go low at the same time. /RAS0 goes low time $t_a$ after /RAS1 goes low. The CLK signal goes high when both /RAS0 and /RAS1 are low. The CLKP signal is triggered to produce a $t_{RP}$ pulse that is superimposed on the output signal /RAS L thus modifying it. In effect, with the $t_{RP}$ pulse, the /RAS L signal is setting up the memory devices for a new cycle. The A10L signal could be either high or low depending on the A10R signal from the counter. The RAS A and RAS PA signals behave as in the above cycles and the $t_{RP}$ pulse from RAS PA has no effect on /RAS L.

Cycles 5 and 6 illustrate the situation where there is a very short period of time, $t_d$, between two cycles such that the memory devices cannot be properly setup for the new cycle. When both /RAS0 and /RAS1 are high for the period $t_d$, RAS L goes high for period $t_d$ which is too short to initiate a new cycle in the DRAMs. In this situation, time $t_a$ is less than time $t_{RP}$. Here, the CLK and CLKP signals are not triggered. The RAS A signal goes high at the trailing edge of /RAS0 and signal RAS PA is triggered to produce a $t_{RP}$ pulse that is superimposed on the output /RAS L signal. Thus, even though there may not be enough setup time given by the /RAS0 and /RAS1 signals, the output /RAS L signal will provide sufficient setup time to the memory devices due to the superimposed $t_{RP}$ pulse from signal RAS PA. The A10L output signal again follows the /RAS1 signal. Signals /RAS2, /RAS3, RAS B, RAS PB, /RAS H, and A10H have similar cycles (not shown).

Although the present invention is illustrated in terms of a circuit including a number of logic gates, a counter, and MMV circuits, it shall be understood that the present invention can be implemented in several manners, and functional equivalents may be achieved through the use of ASICs, programmable logic, or other devices. Furthermore, although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

and wherein said logic circuit is configured to implement the following truth table:

| | Truth Table | | | | | | | |
|---|---|---|---|---|---|---|---|---|
| | Inputs | | Outputs | | Inputs | | Outputs | |
| Operation | /RAS0 | /RAS1 | /RASL | A10L | /RAS2 | /RAS3 | /RASH | A10H |
| REFRESH L | 0 | 0 | 0 | 0 | 0 | 0 | 0 | 0 |
| REFRESH H | 0 | 0 | 0 | 1 | 0 | 0 | 0 | 1 |
| READ/WRITE L | 0 | 1 | 0 | 1 | 0 | 1 | 0 | 1 |
| READ/WRITE H | 1 | 0 | 0 | 0 | 1 | 0 | 0 | 0 |
| SET UP | 1 | 1 | 1 | 1 | 1 | 1 | 1 | 1 |

What is claimed is:

1. Logic means for enabling a memory module comprised of an assembly of non-standard memory devices to emulate an industry standard memory module, the non-standard memory module including a plurality of addressable memory devices, each of which is responsive to a combination of signals including at least one Column Address Strobe (CAS) signal, one Row Address Strobe (RAS) signal, and address input signals $A_0$–$A_{n+1}$, one less than the number of address signals received by said memory module, and is operative to receive and output data signals via data input/output pins, and a circuit board for supporting said memory devices and having connector means for receiving control signals and for receiving and outputting the data signals, the control signals including at least a plurality of CAS signals, a plurality of RAS signals, a WRITE ENABLE signal, and a plurality of computer-generated address input signals $A_0$–$A_n$, the data signals including a plurality of $D_0$–$D_m$ data signals where m is a function of the number of said memory devices, means for coupling the control signals from said connector means to said memory devices, and a databus for coupling the data signals between the data input/output pins of said memory devices and said connector means, said logic means forming a part of said means for coupling the control signals to said memory devices, and comprising:

a logic circuit responsive to said plurality of CAS signals and said plurality of RAS signals and operative to generate a RAS L signal, a RAS H signal, a first extra address signal $A_{n+1}L$, and a second extra address signal $A_{n+1}H$, said RAS L signal providing a row address strobe for a first group L of said memory devices, said RAS H signal providing a row address strobe for a second group H of said memory devices, said address signal $A_{n+1}L$ providing an extra address input for use with said address input signals $A_0$–$A_n$ to address said first group of memory devices, and said address signal $A_{n+1}H$ providing an extra address input for use with said address input signals $A_0$–$A_n$ to address said second group of memory devices.

2. Logic means as recited in claim 1 wherein said assembly of non-standard memory devices are grouped into four memory blocks respectively responsive to four externally generated CAS signals /CAS0, /CAS1, /CAS2, and /CAS3, wherein /RAS0, /RAS1, /RAS2, and /RAS3 represent four externally generated RAS signals;

two of said four memory blocks being included within said group L and two of said four memory blocks being included within said group H, wherein said group L is responsive to output signals /RASL and A10L and said group H is responsive to output signals /RAS H and A10H.

3. Logic means as recited in claim 2 wherein each of said memory blocks is comprised of at least one of said memory devices configured to form a 2M×9 memory block with a parity bit.

4. Logic means as recited in claim 3 wherein each of said memory blocks is comprised of at least one of said memory devices configured to form a 2M×8 memory block without a parity bit.

5. Logic means as recited in claim 4 wherein said logic circuit is responsive to a predetermined relationship between said plurality of RAS signals and operative to generate a RAS precharge pulse $t_{RP}$ on said /RAS L signal and said /RAS H signal which causes a refresh signal to be initiated.

6. Logic means as recited in claim 5 wherein said logic circuit is responsive to particular combinations of said plurality of RAS signals indicating read, write and refresh cycles, and further comprising:

means for detecting signals indicating the end of a read, write or refresh cycle; and means for introducing a $t_{RP}$ pulse on said /RAS L signal and said /RAS H signal which causes sufficient set-up time for said memory devices to start a new cycle.

7. Logic means as recited in claim 1 wherein each of said memory blocks is comprised of at least one of said memory devices configured to form a 2M×9 memory block with a parity bit.

8. Logic means as recited in claim 1 wherein each of said memory blocks is comprised of at least one of said memory devices configured to form a 2M×8 memory block without a parity bit.

9. Logic means as recited in claim 1 wherein said logic circuit is responsive to a predetermined relationship between said plurality of RAS signals and operative to generate a RAS precharge pulse $t_{RP}$ on said /RAS L signal and said /RAS H signal which causes a refresh signal to be initiated.

10. Logic means as recited in claim 1 wherein said logic circuit is responsive to particular combinations of said plurality of RAS signals indicating read, write and refresh cycles, and further comprising:

means for detecting signals indicating the end of a read, write or refresh cycle; and means for introducing a $t_{RP}$ pulse on said /RAS L signal and said /RAS H signal which causes sufficient set-up time for said memory devices to start a new cycle.

11. A memory module including an assembly of non-standard memory devices and adapted to emulate an industry standard memory module, comprising:

a plurality of addressable memory devices, each of which is responsive to a combination of signals including at least one Column Address Strobe (CAS) signal, one Row Address Strobe (RAS) signal, and address input signals $A_0$–$A_{n+1}$, n being one less than the number of address signals received by said memory module, and is operative to receive and output data signals via data input/output pins;

a circuit board for supporting said memory devices and having connector means for receiving control signals and for receiving and outputting the data signals, the control signals including at least a plurality of CAS signals, a plurality of RAS signals, and a plurality of computer-generated address input signals $A_0$–$A_n$, the data signals including a plurality of $D_0$–$D_m$ data signals where m is a function of the number of said memory devices, means for coupling the control signals from said connector means to said memory devices, and a databus for coupling the data signals between the data input/output pins of said memory devices and said connector means, logic means forming a part of said means for coupling the control signals to said memory devices, and comprising:

a logic circuit responsive to said plurality of CAS signals and said plurality of RAS signals and operative to generate a RAS L signal, a RAS H signal, a first extra address signal $A_{n+1}L$, and a second extra address signal $A_{n+1}H$, said RAS L signal providing a row address strobe for a first group L of said memory devices, said RAS H signal providing a row address strobe for a second group H of said memory devices, said address signal $A_{n+1}L$ providing an extra address input for use with said address input signals $A_0$–$A_n$ to address said first group L of memory devices, and said address signal $A_{n+1}H$ providing an extra address input for use with said address input signals $A_0$–$A_n$ to address said second group H of memory devices.

12. A memory module as recited in claim 11 wherein said plurality of addressable memory devices are grouped into four memory blocks respectively responsive to four externally generated CAS signals /CAS0, /CAS1, /CAS2, and /CAS3, and wherein said logic circuit is configured to implement the following truth table:

wherein /RAS0, /RAS1, /RAS2, and /RAS3 represent four externally generated RAS signals;

two of said four memory blocks being included within said first group L and two of said four memory blocks being included within said second group H.

13. A memory module as recited in claim 12 wherein each of said memory blocks is comprised of at least one of said memory devices configured to form a 2M×9 memory block with a parity bit.

14. A memory module as recited in claim 13 wherein each of said memory blocks is comprised of at least one of said memory devices configured to form a 2M×8 memory block without a parity bit.

15. A memory module as recited in claim 14 wherein said logic circuit is responsive to a predetermined relationship between said plurality of RAS signals and operative to generate a RAS precharge pulse $t_{RP}$ on said /RAS L signal and said /RAS H signal which causes a refresh signal to be initiated.

16. A memory module as recited in claim 15 wherein said logic circuit is responsive to particular combinations of said plurality of RAS signals indicating read, write and refresh cycles, and further comprising:

means for detecting signals indicating the end of a read, write or refresh cycle; and means for introducing a $t_{RP}$ pulse on said /RAS L signal and said /RAS H signal which causes sufficient set-up time for said memory devices to start a new cycle.

17. A memory module as recited in claim 11 wherein each of said memory blocks is comprised of at least one of said memory devices configured to form a 2M×9 memory block with a parity bit.

18. A memory module as recited in claim 11 wherein each of said memory blocks is comprised of at least one of said memory devices configured to form a 2M×8 memory block without a parity bit.

19. A memory module as recited in claim 11 wherein said logic circuit is responsive to a predetermined relationship between said plurality of RAS signals and operative to generate a RAS precharge pulse $t_{RP}$ on said /RAS L signal and said /RAS H signal which causes a refresh signal to be initiated.

20. A memory module as recited in claim 11 wherein said logic circuit is responsive to particular combinations of said plurality of RAS signals indicating read, write and refresh cycles, and further comprising:

means for detecting signals indicating the end of a read, write or refresh cycle; and means for introducing a $t_{RP}$ pulse on said /RAS L signal and said /RAS H signal which causes sufficient set-up time for said memory devices to start a new cycle.

21. A method of emulating an industry standard memory module using non-standard memory devices in a memory module, comprising:

| | Truth Table | | | | | | |
|---|---|---|---|---|---|---|---|
| | Inputs | | Output | | Inputs | | Output | |
| Operation | /RAS0 | /RAS1 | /RASL | A10L | /RAS2 | /RAS3 | /RASH | A10H |
| REFRESH L | 0 | 0 | 0 | 0 | 0 | 0 | 0 | 0 |
| REFRESH H | 0 | 0 | 0 | 1 | 0 | 0 | 0 | 1 |
| READ/WRITE L | 0 | 1 | 0 | 1 | 0 | 1 | 0 | 1 |
| READ/WRITE H | 1 | 0 | 0 | 0 | 1 | 0 | 0 | 0 |
| SET UP | 1 | 1 | 1 | 1 | 1 | 1 | 1 | 1 | selecting a particular combination of memory devices and organizing such devices in groups such that data of a particular word length can be input thereto and output therefrom via a databus, such that less than all of the available memory locations can be addressed by externally generated address signals, and such that each memory device can be strobed by an externally generated CAS signal;

providing logic means responsive to externally generated CAS signals and RAS signals, and operative to develop new RAS signals for strobing said memory devices, and operative to develop additional address signals for permitting the addressing of memory locations not addressable by said externally generated address signals; and using said logic means to facilitate the input and output of data to and from said memory module via said data bus.

22. A method as recited in claim 21 wherein said assembly of non-standard memory devices includes four memory blocks, two of said four memory blocks being included within a first group L and two of said four memory blocks being included within a second group H, each of the memory blocks respectively responsive to four externally generated CAS signals /CAS0, /CAS1, /CAS2, and /CAS3, said logic means being configured to implement the following truth table:

| | Truth Table | | | | | | | |
|---|---|---|---|---|---|---|---|---|
| | Inputs | | Outputs | | Inputs | | Outputs | |
| Operation | /RAS0 | /RAS1 | /RASL | A10L | /RAS2 | /RAS3 | /RASH | A10H |
| REFRESH L | 0 | 0 | 0 | 0 | 0 | 0 | 0 | 0 |
| REFRESH H | 0 | 0 | 0 | 1 | 0 | 0 | 0 | 1 |
| READ/WRITE L | 0 | 1 | 0 | 1 | 0 | 1 | 0 | 1 |
| READ/WRITE H | 1 | 0 | 0 | 0 | 1 | 0 | 0 | 0 |
| SET UP | 1 | 1 | 1 | 1 | 1 | 1 | 1 | 1 | wherein /RAS0, /RAS1, /RAS2, and /RAS3 represent four externally generated RAS signals, /RAS L and /RAS H are said new RAS signals generated by said logic means for respectively strobing said first group L and said second group H of said memory blocks, and A10L and A10H are said additional address signals generated by said logic means for addressing said first group L and said second group H respectively.

23. A method as recited in claim 22 wherein each of said memory blocks is comprised of one or more of said memory devices configured to form a 2M×9 memory block with a parity bit.

24. A method as recited in claim 23 wherein each of said memory blocks is comprised of one or more of said memory devices configured to form a 2M×8 memory block without a parity bit.

25. A method as recited in claim 24 wherein said logic means is responsive to a predetermined relationship between said plurality of RAS signals and operative to generate a RAS precharge pulse $t_{RP}$ on said /RAS L signal and said /RAS H signal which causes a refresh signal to be initiated.

26. A method as recited in claim 25 wherein said logic means is responsive to particular combinations of said plurality of RAS signals indicating read, write and refresh cycles, and further comprising:

means for detecting signals indicating the end of a read, write or refresh cycle; and means for introducing a $t_{RP}$ pulse on said /RAS L signal and said /RAS H signal which causes sufficient set-up time for said memory devices to start a new cycle.

27. A method as recited in claim 21 wherein each of said memory blocks is comprised of at least one of said memory devices configured to form a 2M×9 memory block with a parity bit.

28. A method as recited in claim 21 wherein each of said memory blocks is comprised of at least one of said memory devices configured to form a 2M×8 memory block without a parity bit.

29. A method as recited in claim 21 wherein said logic means is responsive to a predetermined relationship between said plurality of RAS signals and operative to generate a RAS precharge pulse $t_{RP}$ on said /RAS L signal and said /RAS H signal which causes a refresh signal to be initiated.

30. A method as recited in claim 21 wherein said logic means is responsive to particular combinations of said plurality of RAS signals indicating read, write and refresh cycles, and further comprising:

means for detecting signals indicating the end of a read, write or refresh cycle; and means for introducing a $t_{RP}$ pulse on said /RAS L signal and said /RAS H signal which causes sufficient set-up time for said memory devices to start a new cycle.

31. In a memory module including:

a plurality of addressable memory devices, each of which is responsive to a combination of signals including at least one Column Address Strobe (CAS) signal, a Row Address Strobe (RAS) signal, and address signals $A_0$–$A_{n+1}$, n being one less than the number of address signals received by said memory module, and is operative to receive and output data signals via data input/output pins;

a circuit board for supporting said memory devices and having connector means for receiving control signals and for receiving and outputting the data signals, the control signals including at least a plurality of CAS signals, a plurality of RAS signals, and a plurality of computer-generated address signals $A_0$–$A_n$, the data signals including a plurality of $D_0$–$D_m$ data signals where m is a function of the number of said memory devices, means for coupling said CAS signals and said RAS signals from said connector means to a logic means and for coupling said CAS signals and said address signals to said memory devices, and a databus for coupling the data signals between the data input/output pins of said memory devices and said connector means, an improved means for coupling the control signals to said memory devices, comprising:

a logic circuit responsive to said CAS signals and said RAS signals and operative to generate at least one new RAS signal, and at least one extra address signal $A_{n+1}$, said new RAS signal providing a row address strobe for said memory devices, and said extra address signal $A_{n+1}$ providing an extra address signal for use with said address signals $A_0$–$A_n$ to address said memory devices.

32. In a memory module as recited in claim 31 wherein said logic circuit is responsive to a predetermined relationship between said RAS signals and operative to generate a RAS precharge pulse $t_{RP}$ on said at least one new RAS signal which causes a refresh signal to be initiated.

33. In a memory module as recited in claim 32 wherein said logic circuit is responsive to particular combinations of said plurality of RAS signals indicating read, write and refresh cycles, and further comprising:

means for detecting signals indicating the end of a read, write or refresh cycle; and means for introducing a $t_{RP}$ pulse on said at least one new RAS signal which causes sufficient set-up time for said memory devices to start a new cycle.

34. In a memory module as recited in claim 31 wherein said logic circuit is responsive to particular combinations of said plurality of RAS signals indicating read, write and refresh cycles, and further comprising:

means for detecting signals indicating the end of a read, write or refresh cycle; and means for introducing a $t_{RP}$ pulse on said at least one new RAS signal which causes sufficient set-up time for said memory devices to start a new cycle.

35. A memory module comprising:

a plurality of addressable memory devices, each of which is responsive to a combination of signals including a Column Address Strobe (CAS) signal, a Row Address Strobe (RAS) signal, and address signals $A_0$–$A_{n+1}$, n being one less than the number of address signals received by said memory module, and is operative to receive and output data signals via data input/output pins;

a circuit board for supporting said memory devices and having connector means for receiving control signals and for receiving and outputting the data signals, the control signals including at least a plurality of CAS signals, a plurality of RAS signals, and a plurality of computer-generated address signals $A_0$–$A_n$, the data signals including a plurality of $D_0$–$D_m$ data signals where m is a function of the number of said memory devices, means for coupling said CAS signals and said RAS signals from said connector means to a logic means and for coupling said CAS signals and said address signals to said memory devices, and a databus for coupling the data signals between the data input/output pins of said memory devices and said connector means, said logic means forming a part of said means for coupling the control signals to said memory devices, and comprising a logic circuit responsive to said plurality of CAS signals and said RAS signals and operative to generate at least one new RAS signal, and at least one extra address signal $A_{n+1}$, said new RAS signal providing a row address strobe for said memory devices, and said extra address signal $A_{n+1}$ providing an extra address signal for use with said address signals $A_0$–$A_n$ to address said memory devices.

36. A memory module as recited in claim 35 wherein said logic circuit is responsive to a predetermined relationship between said plurality of RAS signals and operative to generate a RAS precharge pulse $t_{RP}$ on said at least one new RAS signal which causes a refresh signal to be initiated.

37. A memory module as recited in claim 36 wherein said logic circuit is responsive to particular combinations of said plurality of RAS signals indicating read, write and refresh cycles, and further comprising:

means for detecting signals indicating the end of a read, write or refresh cycle; and means for introducing a $t_{RP}$ pulse on said at least one new RAS signal which causes sufficient set-up time for said memory devices to start a new cycle.

38. A memory module as recited in claim 35 wherein said logic circuit is responsive to particular combinations of said plurality of RAS signals indicating read, write and refresh cycles, and further comprising:

means for detecting signals indicating the end of a read, write or refresh cycle; and means for introducing a $t_{RP}$ pulse on said at least one new RAS signal which causes sufficient set-up time for said memory devices to start a new cycle.

\* \* \* \* \*